(12) United States Patent
Gopal et al.

(10) Patent No.: US 7,272,544 B2
(45) Date of Patent: Sep. 18, 2007

(54) INTEGRATED MODELING THROUGH SYMBOLIC MANIPULATION

(75) Inventors: Vipin Gopal, Manchester, CT (US); Jan Jelinek, Plymouth, MN (US); Alan Haggerty, Hamel, MN (US)

(73) Assignee: Honeywell International Inc., Morristown, NJ (US)

( * ) Notice: Subject to any disclaimer, the term of this patent is extended or adjusted under 35 U.S.C. 154(b) by 558 days.

(21) Appl. No.: 10/758,630

(22) Filed: Jan. 15, 2004

(65) Prior Publication Data

US 2005/0159934 A1 Jul. 21, 2005

(51) Int. Cl.
*G06F 17/10* (2006.01)

(52) U.S. Cl. .................... 703/2; 707/100; 700/121; 700/266; 700/269; 700/108; 709/318

(58) Field of Classification Search .............. 703/2, 703/14; 707/100; 700/121, 266, 31, 269, 700/95, 108, 51, 29; 709/318; 705/7; 706/15; 702/51
See application file for complete search history.

(56) References Cited

U.S. PATENT DOCUMENTS

| | | | | |
|---|---|---|---|---|
| 5,305,221 A | * | 4/1994 | Atherton | 700/96 |
| 5,467,291 A | * | 11/1995 | Fan et al. | 703/14 |
| 5,586,033 A | * | 12/1996 | Hall | 701/50 |
| 5,587,935 A | | 12/1996 | Brooks et al. | 364/578 |
| 5,590,360 A | | 12/1996 | Edwards | 395/800 |
| 5,691,895 A | * | 11/1997 | Kurtzberg et al. | 700/29 |
| 5,727,128 A | | 3/1998 | Morrison | 395/10 |
| 5,781,454 A | | 7/1998 | Alexander | 364/578 |
| 5,930,512 A | | 7/1999 | Boden et al. | 395/710 |
| 5,980,096 A | * | 11/1999 | Thalhammer-Reyero | 707/100 |
| 6,011,917 A | | 1/2000 | Leymann et al. | 395/702 |
| 6,028,997 A | | 2/2000 | Leymann et al. | 395/701 |
| 6,038,393 A | | 3/2000 | Iyengar et al. | 395/701 |
| 6,065,009 A | | 5/2000 | Leymann et al. | 707/10 |
| 6,076,048 A | * | 6/2000 | Gunther et al. | 702/51 |
| 6,263,255 B1 | * | 7/2001 | Tan et al. | 700/121 |
| 6,535,795 B1 | * | 3/2003 | Schroeder et al. | 700/266 |

(Continued)

OTHER PUBLICATIONS

Shapiro, B., "Solving the optimal mistuning problem by symmetry: A general framework for extending flutter boundaries in turbomachines via mistuning", California Institute of Technology, Mar. 1997.*

(Continued)

*Primary Examiner*—K. Thangavelu
(74) *Attorney, Agent, or Firm*—Schwegman, Lundberg, Woessner & Kluth, P.A.

(57) ABSTRACT

Integrated modeling and symbolic manipulation is leveraged for the derivation, construction, maintenance, and reuse of application-independent models. Related models created for different applications share a common ancestry and maintain model consistency while enabling the models to share information about the process. Environment independent proper ancestor models (PAMs) are created for generic components of a process, such as a distillation or flash column. Models underlying an application may be comprised of various representations of multiple such processes corresponding to many different physical components. PAMs contain symbolic representations of different sub processes that occur within a process or component. A user makes assumptions about the component, by indicating how sub processes are to be considered or not considered. PAMs are then modified in accordance with the assumptions to derive a specific environment model (SEM).

21 Claims, 7 Drawing Sheets

U.S. PATENT DOCUMENTS

| | | | |
|---|---|---|---|
| 6,654,649 B2* | 11/2003 | Treiber et al. | 700/31 |
| 6,735,489 B1* | 5/2004 | Khurana et al. | 700/95 |
| 2002/0052858 A1* | 5/2002 | Goldman et al. | 706/15 |
| 2002/0072828 A1* | 6/2002 | Turner et al. | 700/269 |
| 2002/0194393 A1* | 12/2002 | Hrischuk et al. | 709/318 |
| 2002/0198697 A1* | 12/2002 | Datig | 704/1 |
| 2004/0034555 A1* | 2/2004 | Dismukes et al. | 705/7 |
| 2004/0068332 A1* | 4/2004 | Ben-Gal et al. | 700/51 |
| 2004/0088065 A1* | 5/2004 | Robitaille et al. | 700/95 |
| 2004/0093107 A1* | 5/2004 | Good et al. | 700/108 |

OTHER PUBLICATIONS

; Hestenes, D., "Modeling software for learning and doing physics", Arizona state university, 1996.*

Motta et al., "Specification of knowledge components for reuse", Eleventh International conference on Software engineering and Knowledge engineering, 1999.*

Hamie et al., "Navigation Expressions in object-oriented modeling", University of Brighton, UK 1998.*

Ehrig et al., "Application of category theory to area of algebraic specification in computer science", Applied categorical structures, 1998.*

Eborn et al., "ThermoFlow: A Thermo-Hydraulic library in Modelica", Lund University, Sweden, 2000.*

Kemmerer, S., "STEP—The Grand Experience", National Institute of Standards and Technology, Jul. 1999.*

* cited by examiner

110 $dM_V/dt = E - V$

115 $dM_L/dt = F - L - E$

120 $dH_V/dt = Eh_V(T_L) - Vh_V(T_V) + \phi_E$

125 $dH_L/dt = Fh_F - Lh_L(T_L) - Eh_V(T_L) + \phi - \phi_E$

130 $E = kLA(P^* - P)$

135 $\phi_E = uA(T_L - T_V)$

```
noTnoM1={
    Mv[i]'==Fv[i]+E[i]-V[i],
    Ml[i]'==Fl[i]-L[i]-E[i],
    Hv'==Sum[Fv[i]hfv[i]+E[i]hv[i][Tl]-V[i]hv[i][Tv], {i, ncomp}],
    Hl'==Sum[Fl[i]hfl[i]-L[i]hl[i][Tl]+E[i]hv[i][Tl], {i, ncomp}] } noTnoM2={
    E[i]==klA(Psat[i]-P),
    QE==uA(Tl-Tv) };

noTnoM3={
    Hv==Sum[Mv[i]hv[i][Tv], {i, ncomp}],
    Hl==Sum[Ml[i]hl[i][Tl], {i, ncomp}],
    Psat[i]==Pl[i][Tl],
    PVv==Sum[Mv[i], {i, ncomp}] RTv};

noTnoM4={Vt==Vv+Sum[Ml[i]/Rho_l[i], {i, ncomp}]};

noTnoM=Join[noTnoMl, noTnoM2, noTnoM3, noTnoM4]
```

Fig.2

$$\phi_E = 0$$
$$H = H_L + H_V$$
$$T = T_L = T_V$$

$$dM/dt = F - L - V$$
$$dH/dt = Fh_F - Lh_L - Vh_V + \phi$$
$$H = Mh_L(T)$$

Fig. 6

$$M[i]' = = Fl[i] + Fv[i] - L[i] - V[i]$$
$$H' = = N + \sum_{i=1}^{ncomp} Fl[i]hfl[i] - \sum_{i=1}^{ncomp} L[i]hl[i][T] + \sum_{i=1}^{ncomp} Fv[i]hfv[i]$$
$$- \sum_{i=1}^{ncomp} M[i] - Ohl[i][T]$$
$$H = = \sum_{i=1}^{ncomp} M[i]hl[i][T]$$

```
Out[435]= {0==e[i][j]+Fv[i][j]+V[i][-1+j]-V[i][j],
          0== -e[i][j]+Fl[i][j]-L[i][j]+L[i][1+j],
                      ncomp
          0==QE[j]+     ∑    (Fv[i][j]hfv[i][Tf[j]]+e[i][j]hv[i][Tl[j]]-
                       i=1
                        ncomp
          V[i][j]hv[i][Tv[j]]+V[i][j-1]hv[i][Tv[j-1]]),
                        ncomp
          0==Q[j]-QE[j]+  ∑   (Fl[i][j]hfl[i][Tf[j]]-L[i][j]hl[i][Tl[j]])-
                         i=1
          e[i][j]hv[i][Tl[j]]+L[i][j+1]hl[i][Tl[j+1]]),
          e[i][j]==Akl(-P[j]+Psat[i][j]), QE[j]==Au(Tl[j]-Tv[j]),
                   ncomp
          Hv[j]==   ∑   Mv[i][j]hv[i][Tv[j]],
                   i=1
                   ncomp
          Hl[j]==   ∑   Ml[i][j]hl[i][Tl[j]],
                   i=1
          Psat[i][j]==Pl[i][Tl[j]],
                        ⎛ ncomp          ⎞
          P[j]Vv[j]==R  ⎜  ∑   Mv[i][j]  ⎟ Tv[j],
                        ⎝ i=1            ⎠
                   ncomp     Ml[i][j]
          Vt[j]==   ∑    ─────────────── +Vv[j]}
                   i=1   Rho_l[i][Tl[j]]
```

*Fig. 10*

INTEGRATED MODELING THROUGH SYMBOLIC MANIPULATION

FIELD OF THE INVENTION

The present invention relates to process modeling. More specifically, the present invention relates to methods and systems for producing integrated process models.

BACKGROUND OF THE INVENTION

Businesses are constantly driven by ever stronger global competitive pressures to reduce costs while complying with ever more stringent safety and environmental regulations. Many of these businesses are in industries that are heavily process based, such as the chemical industry, the petrochemical industry, and other manufacturing industries. Process modeling has been used to accelerate and enable design, testing, and implementation of new processes as well as improvements to existing processes. A broad variety of applications have found need for process modeling, including process simulation, optimization, advanced control, planning, scheduling, training, and maintenance. Equally numerous are the types of process models used by these applications: first principles, heuristic, rule-based, and empirical are examples.

However, model-based applications in process industries have not achieved their full potential since process models, which lie at the heart of those applications, are not efficiently used. The costs associated with developing, implementing, and maintaining process models often inhibit the efficient use of model-based process applications. There exist at least three major obstacles to the reduction of these costs: 1) lack of a model development methodology for creating and maintaining application-independent models, 2) lack of a framework for addressing model robustness and uncertainty, and 3) lack of an integrated software environment centered around plant-wide information databases.

Typically, process models are developed with methodologies and procedures tailored specifically for individual applications. Consequently, porting process models to new application environments invariably lead to duplication of effort and inconsistent results. Process engineers may spend significant amounts of time either developing the models from scratch or manually transferring and modifying process models from one application to another. The time spent on such development and transfer is not only unproductive, but also error-prone as incorrect transfer and use frequently introduce errors. To cite an example of the problems mentioned above due to modeling inefficiencies, plant-wide optimization applications in process industries are frequently shut down because the underlying process model could not be easily updated to reflect changes in the plant. In summary, lack of efficient modeling mechanisms affects the performance of the model-based process applications, at the heart of which are process models.

SUMMARY OF THE INVENTION

An open, flexible, and integrated environment is used for process model development. Integrated modeling and symbolic manipulation is leveraged for the derivation, construction, maintenance, and reuse of application-independent models. Related models created for different applications share a common ancestry and maintain model consistency while enabling the models to share information about the process. The present invention finds utility in a broad variety of applications such as process design and analysis, process operations, maintenance, and logistics.

In one embodiment, environment independent proper ancestor models (PAMs) are created for generic components of a process, such as a distillation or flash column. An application may be comprised of multiple such processes corresponding to many different physical components. PAMs contain symbolic representations of different sub-processes that occur within a process or component. A user makes assumptions about the component, by indicating how sub-processes are to be considered or not considered. PAMs are then modified in accordance with the assumptions to derive a specific environment model (SEM). Conversion of multiple PAMs is easily performed to create a specific model for one application. The invention facilitates better inter-application consistency, plant-model consistency, and model reuse.

DETAILED DESCRIPTION OF THE INVENTION

In the following detailed description of the present invention, reference is made to the accompanying Drawings, which form a part hereof, and in which are shown by way of illustration specific embodiments in which the present invention may be practiced. It should be understood that other embodiments may be utilized and structural changes may be made without departing from the scope of the present invention.

Proper ancestor models ("PAMs") contain environment independent symbolic descriptions of various components of a manufacturing process. For example, in an embodiment useful to the chemical industry, multiple PAMs comprising a PAM library contain process models representing distillation columns, reactors, condensers, and heat exchangers of various designs, referred to as components. PAMs are generic in nature, and not influenced by environmental conditions. A specific environment model (SEM) representing a particular component is derived from a PAM by introducing additional assumptions describing the specifics of its physical implementation in the process or desired level of modeling abstraction. Listing all the assumptions explicitly and keeping them in one place ensures that the same component is consistently described across many applications, even though each type of component may be represented (by SEMs) on different levels of abstraction in different applications.

Figure 1:
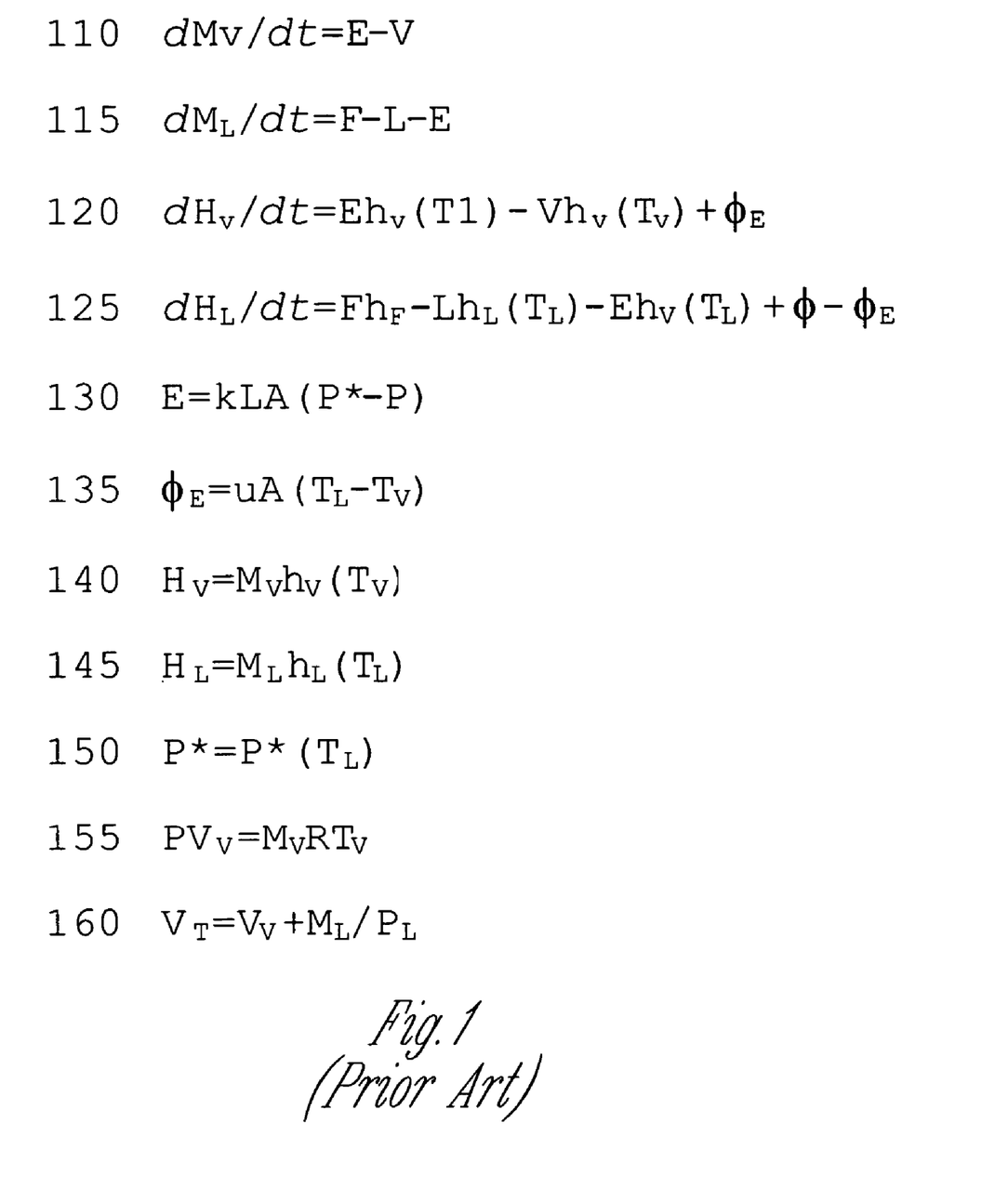
FIG. 1 illustrates a prior art set of equations for generically modeling a flash column
Figure 2:
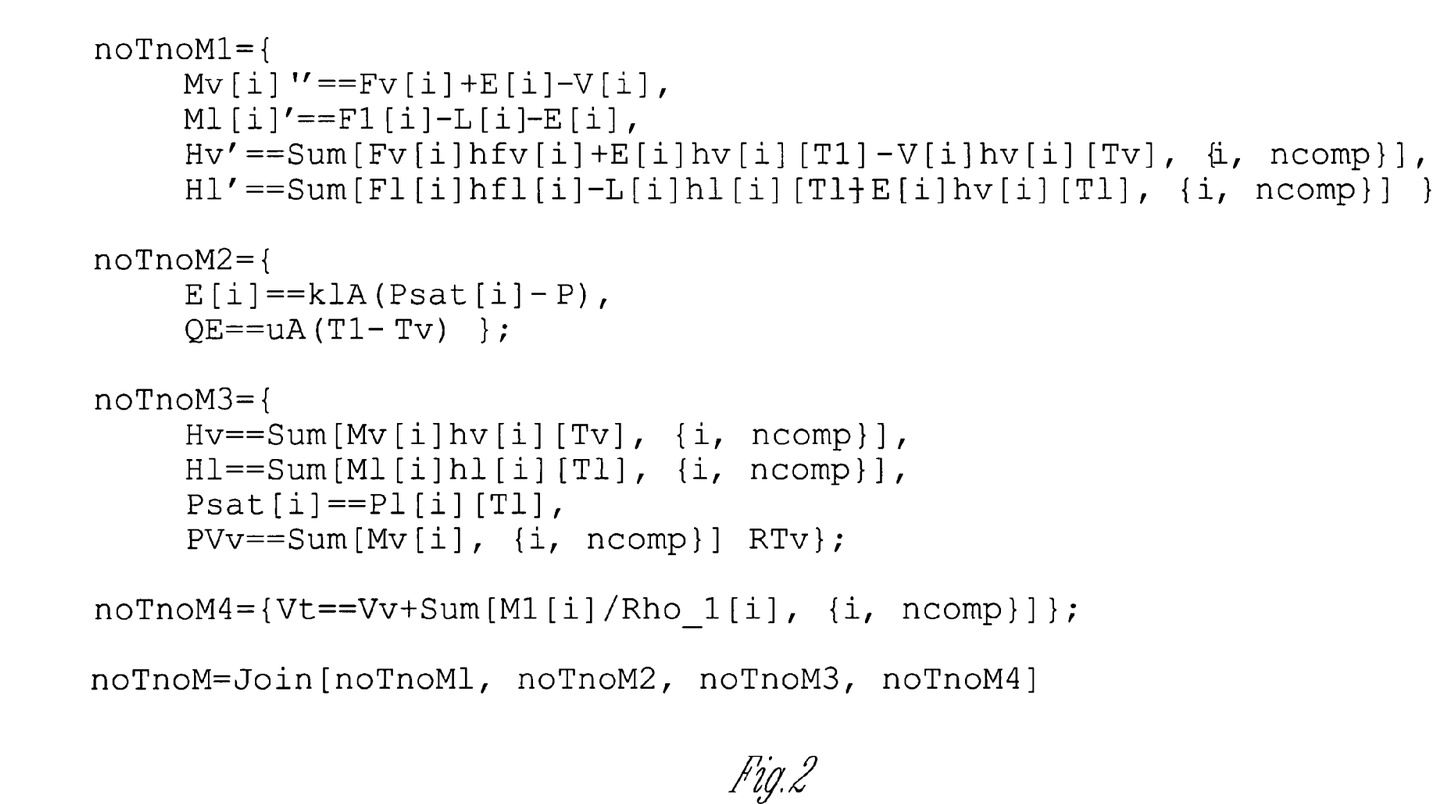
FIG. 2 illustrates a symbolic representation of the equations of FIG. 1.

A PAM is a description of a process containing no environment-specific knowledge. PAMs are written in a formal language (that is, a symbolic or equation-based format) with capabilities for the clear and natural description of mathematical expressions and constructs such as symbolic placeholders for unspecified operations or calculations. One example of a set of equations describing the behavior of a component such as a flash column in a typical process automation environment is shown in FIG. 1. FIG. 2 is a symbolic language representation of the same equations. Symbolic languages utilized in various embodiments comprise Mathematica (available from Wolfram Research), Axiom (available from Numerical Algorithms Group), MAPLE (available from Maple in Canada) and ADIFOR (automatic differentiation of Fortran) (available from Rice University), and possibly others currently existing and invented in the future. The Mathematica symbolic language representation is illustrated in FIG. 2.

Proper ancestor models are application independent. In order to be so, they focus on capturing the physical and chemical aspects of the modeled component's behavior, while avoiding all the aspects related to its particular implementation on the plant floor. Also specifics related to program implementation of the component model are avoided in PAMs to allow their use in and porting between applications written in different programming languages and using different programming methods. According to the present invention, process model developers (for example, engineers, developers, and plant operators) can focus on specific process issues while distinguishing process issues from specific environmental issues such as implementation platform and programming language. After a process model developer creates one or more PAMs, the PAMs are stored in a library. Thus, a set of proper ancestor models in an embodiment of the present invention is referred to as the PAM library. The PAM library is implementable on a single computer using a single database, for example. Alternately, the PAM library can be distributed over a network with different PAMs residing on different computers connected via a network.

Symbolic manipulation is used to construct SEMs from a library of PAMs in one embodiment. A user creates SEMs by choosing one or more PAMs from a PAM library and specifying process assumptions to customize the PAM into a desired SEM. The process assumptions embody more specific knowledge about the user-desired process model. The system combines the user-chosen assumptions with the user-chosen PAMs to produce the SEMS. The user-chosen assumptions could be one or more of the following. The process assumptions allow the user to add specific knowledge concerning the component's physical realization to a more generic process model (that is, a PAM). The methodological assumptions allow the user to choose specific mathematical methods and algorithms he prefers to solve the models. The programming assumptions allow the user to choose specific programming methods and languages, in which the SEMs are to be produced. The construction of SEMs in accordance with the present invention ensures increased consistency across applications, better plant-model consistency, facilitation of model reuse and avoidance of duplication of effort in application development.

A user does not have to understand or know what language the process models or assumptions are written in. The present system presents symbolic representations of the process models and process assumptions to the user. The user chooses process models and process assumptions by choosing their symbolic representations. In one embodiment of the present invention, the user chooses process models and process assumptions from a menu of their symbolic representations displayed on a computer screen.

The equations illustrated in FIG. 1 constitute an embodiment of a PAM according to the present invention. FIG. 1 illustrates equations that describe a process typically embodied in a flash column, the simplest of process unit operations. Flash columns are used in the chemical industry to separate mixtures. For example, a distillation column could be considered as a stack of flash columns. The equations in FIG. 1 are typically created by an engineer wishing to describe or model a generic process found in a flash column. The equations in FIG. 1 by themselves are prior art, and are shown here only for illustrative purposes and simplicity. They can be found in the literature and are very fundamental. For example, in FIG. 1, the variable $M_V$ represents the amount of vapor present in the flash column, the variable $M_L$ represents the amount of liquid present in the flash column, and the variable P* represents the vapor pressure. Once the equations are created, they can then be stored in the PAM library for future use.

The equations of FIG. 1 represent multiple aspects of the type of component it is modeling. At 110, the rate of change of the mass of vapor holdup is represented. Other representations include rate of change of the mass of liquid holdup 115, rate of change of the enthalpy of the vapor 120, enthalpy change of the liquid 125, mass transfer correlation 130, energy transfer correlation 135, vapor and liquid enthalpy equations 140 and 145, vapor pressure equation 150, gas law 155 and volume correlation 160.

FIG. 2 illustrates another embodiment of a PAM according to the present invention. Conceptually, the equations in FIG. 2 define the same model of a flash column. However, viewed as a description of process knowledge, the model in FIG. 2 is different from the model in FIG. 1. Rather than being recorded in the traditional mathematical notation which computers cannot safely understand due to its ambiguity, the equations illustrated in FIG. 2 are written in a symbolic format using Mathematica. A user desiring to create a PAM according to the present invention can use Mathematica as the formal language for expressing the equations that comprise the PAM.

Figure 3:
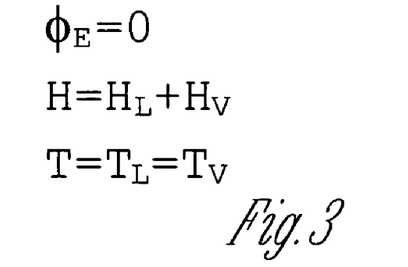
FIG. 3 illustrates selected process assumptions for a particular flash column.
Figure 4:
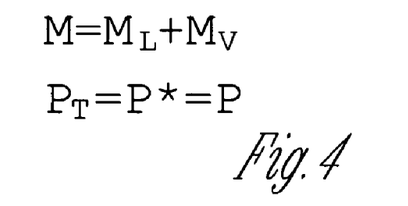
FIG. 4 illustrates further selected process assumptions for a particular flash column.
Figure 5:
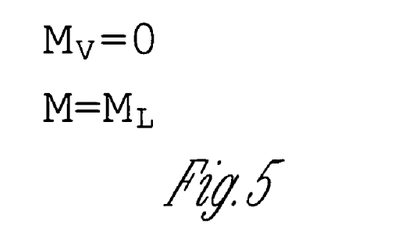
FIG. 5 illustrates still further selected process assumptions for a particular flash column.

A user wishing to create a specific process model first chooses one or more PAMs, such as the PAM of a flash column illustrated in FIG. 1, and then gradually adds desired process methodological and programming assumptions in that order in one embodiment. These assumptions embody more specific knowledge about the desired process to be modeled and the way it should be modeled. For example, FIG. 3 illustrates equations representing the process assumption that a process model, such as the one embodied in FIG. 1, exhibits thermal equilibrium. Similarly, FIG. 4 illustrates equations representing an assumption of material equilibrium and FIG. 5 illustrates equations representing the assumption that there exists no vapor holdup.

The usual or more common process assumptions, as well as the PAMs are chosen by use of a graphical interface that provides such options in common language such as English in one embodiment. That is the user does not have to enter the equations into the system. In fact, a user is not even required to know any implementation details about the PAMs or the process assumptions. The user is not required to know what the underlying equations look like or even what formal language they are written in. For example, in one embodiment the user simply chooses the process assumptions by choosing individual process assumptions from a menu of process assumptions displayed on a computer screen. In addition to that, a more sophisticated user can enter atypical or unique assumptions directly in the symbolic language used to encode PAMs.

A user of the present invention may manipulate the equations defining PAMs to create equations defining more specific models without having to know any of the underlying equations or even what formal language the equations were written in. The user chooses assumptions (for example, thermal equilibrium) and the system then manipulates the underlying symbolic equations to produce the desired model for the user. Again, if desired, a more sophisticated user can direct the PAM customization process by specifying methodological and programming assumptions in a suitable language.

Once a user has chosen at least one PAM and at least one process assumption, the present system then combines the user-chosen process assumption(s) with the user-chosen PAM(s) to produce one or more specific process models. This is accomplished by merging the equations representing the user-chosen assumption(s) with the equations representing the user-chosen PAM(s) to produce a new set of equations, which represent a specific process model. Thus, each specific process model is represented by a set of equations produced by combining equations from one or more PAMs with the equations representing one or more process assumption(s). An SEM Builder combines PAMs with process assumptions to produce specific process models.

In this manner, an SEM can be thought of as a model for a particular application derived by a rigorous and well-documented process from one or more PAMs residing in the PAM library though its assumption-driven customization. Allowing the user to symbolically choose one or more PAMs and choose one or more process assumptions enables the extraction of fidelity levels appropriate for each application. For example, process design calculations generally involve geometric and capacity considerations, while process control applications are generally involved with adjusting operating conditions and variables to satisfy certain constraints.

Figure 6:
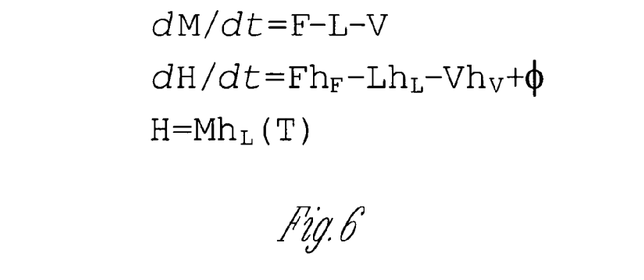
FIG. 6 illustrates a set of equations representing a specific model for a flash column based on selected assumptions.
Figure 7:
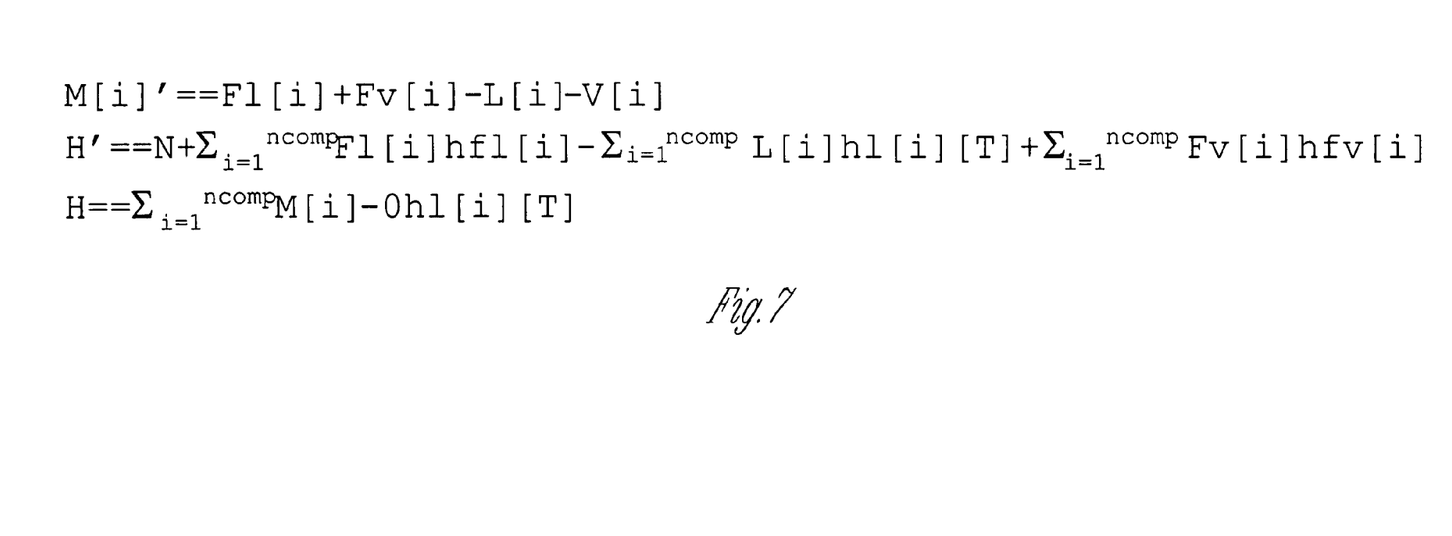
FIG. 7 illustrates a symbolic representation of the equations of FIG. 6.

FIGS. 6 and 7 illustrate two examples of equations representing specific process models. FIG. 6 illustrates equations produced by combining the PAM of FIG. 1 with assumptions of thermal equilibrium, material equilibrium, and no vapor holdup. FIG. 7 illustrates a symbolic representation produced by combining the PAM of FIG. 2 with these same assumptions.

Specific environment models of the present invention can be developed all the way to computer programming code that is executable on a proposed platform. The use of a symbolic language enables autogeneration of code directly from the symbolic representation of the PAM given the assumptions in a known manner. For example, the derived SEM is a computer-implemented simulation of the underlying specific process model.

For each SEM created, the SEM Builder creates a transformation log. The transformation log contains information necessary to record how the SEM was created. This information includes, for example, what PAMs were chosen and what assumptions were chosen as well as how the underlying equations were combined. The transformation log can be thought of as a history of how a SEM was derived. The transformation log helps to identify the contents of a model and facilitates the model's reuse. For example, the transformation log allows a user to start with a previously created SEM for a similar application and work backwards to determine what if any assumptions need to be changed to produce a new SEM more suitable for a new application.

In one embodiment, the present invention is a computer-implemented method. The computer programming languages that can be utilized to implement the methods of the present invention are not particularly critical. For example, methods of the present invention could be implemented using the C programming language, C++, Visual Basic, etc. Methods according to the present invention may be implemented so as to run on a single computer or on multiple computers connected via a network.

The computing hardware utilized to perform methods of the present invention or utilized to create system according to the present invention is not particularly critical. For example, in one embodiment the present invention is a single computer containing computer-executable instructions capable of performing the methods according to the present invention. The particular type of computer can be determined by a practitioner of ordinary skill in the programming arts. Alternatively, the present invention can be embodiment in multiple computers connected via a network. The multiple computers may vary in power and type and may vary in what parts of the present invention they embody. For example, the PAM library may exist on a server connected to user workstations via a network. The network can be a local area network or the Internet, for example. The user workstations provide the various users the ability to interact with the system. For example, a process designer can interact with one workstation to create PAMs, which get sent over the network and are stored in the PAM library residing on the server. A user desiring a specific process model can work at a second workstation, choosing appropriate PAMs and entering process and other assumptions. The second workstation retrieves the appropriate PAMs over the network from the PAM library and combines them with the user-entered process assumptions to produce one or more SEMs.

Figure 8:
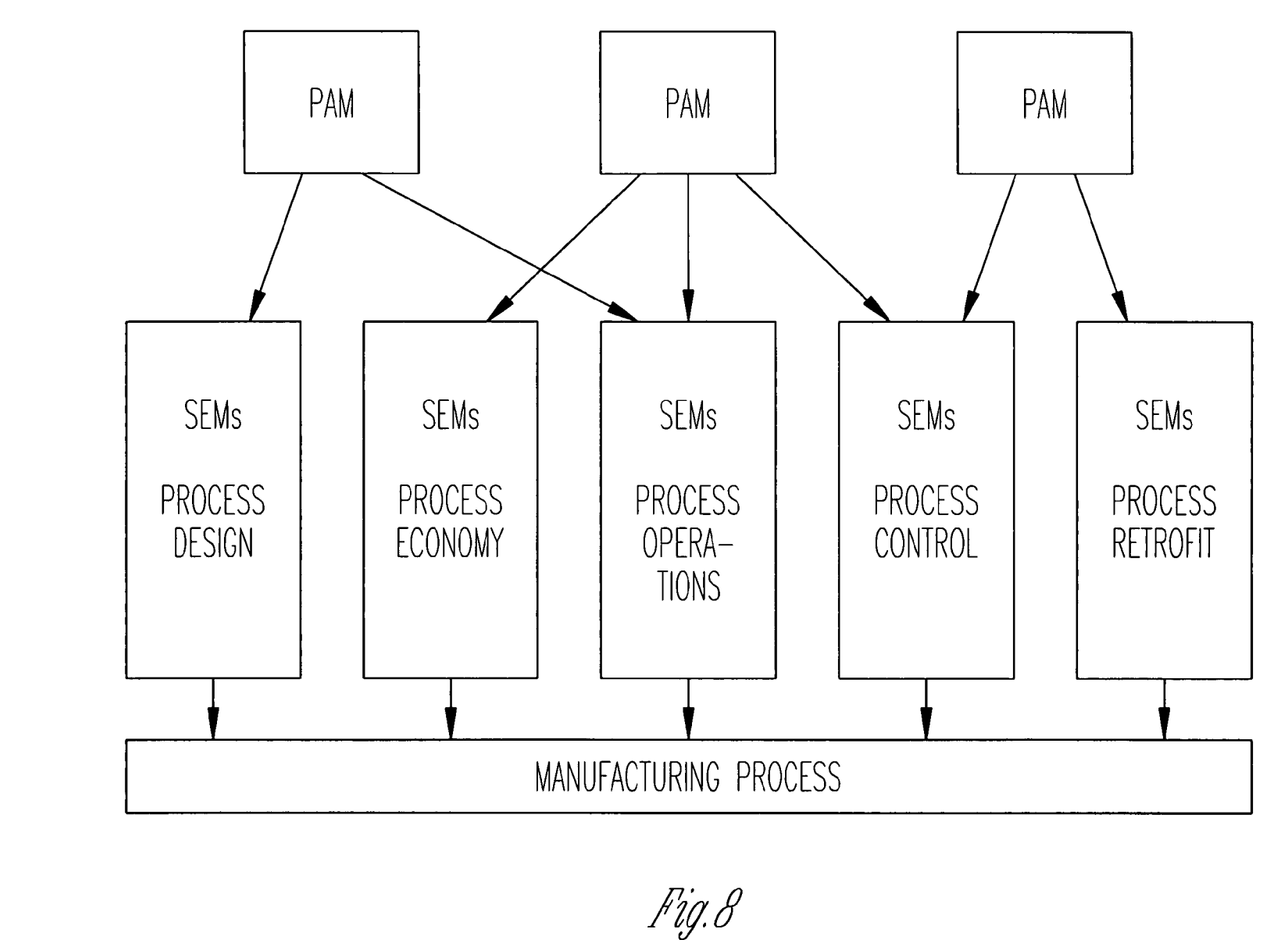
FIG. 8 is a block diagram showing the use of proper ancestor models in generating specific environment models for multiple applications used in a manufacturing process.

FIG. 8 is a block diagram showing the use of proper ancestor models in generating specific environment models for multiple applications used in a manufacturing process. It illustrates the overall process of using PAMs to create SEMs for modeling a manufacturing process. Each PAM is used to create one or more SEMs as shown by modifying the PAM based on sets of assumptions. Several different types of SEMs are shown each corresponding to one or more applications. They include but are not limited to process design, process economy, process operations, process control and process retrofit. Many others may also be utilized.

Figure 9:
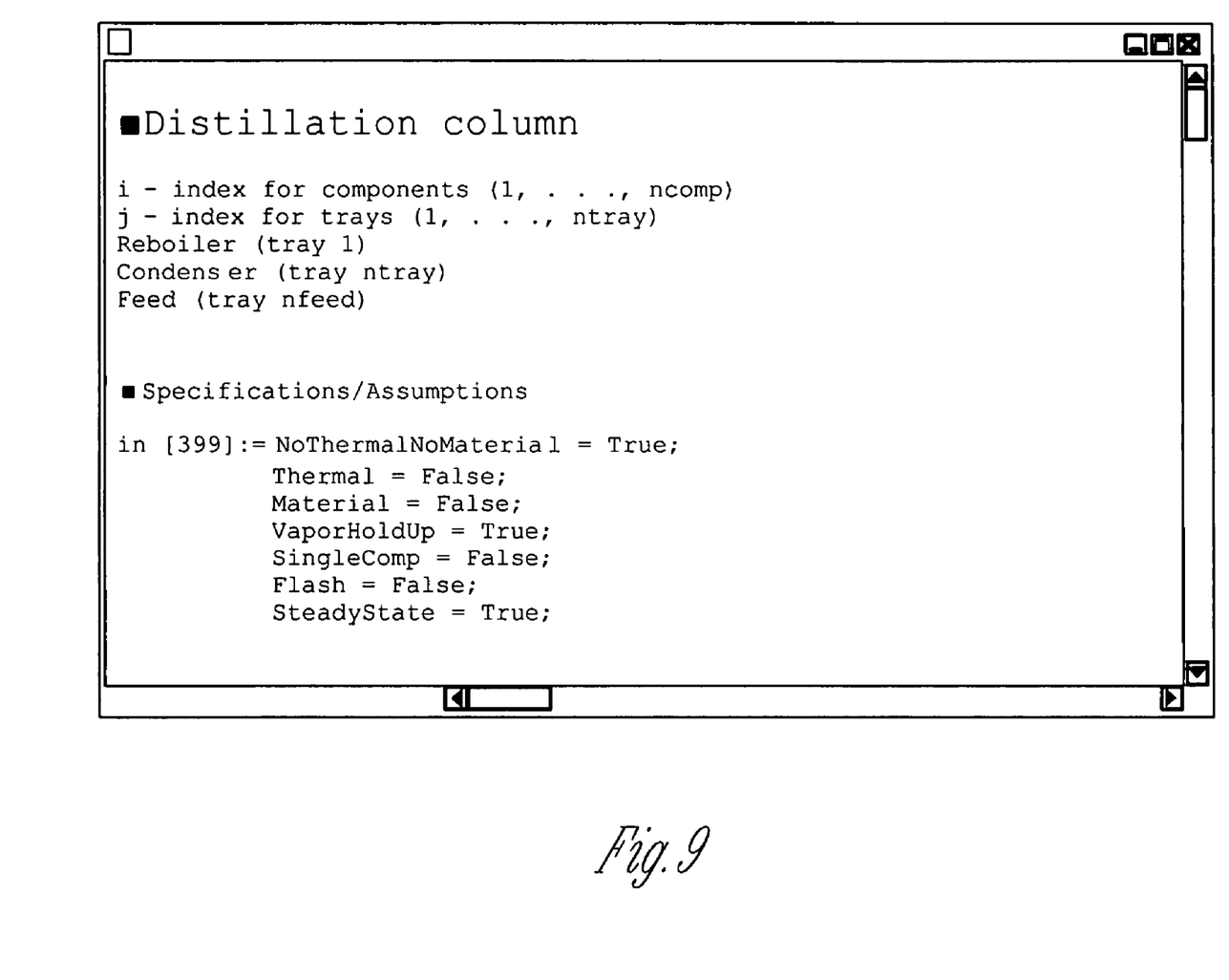
FIG. 9 is a screen shot of an interface for specification of assumptions for generating a specific environment model for a distillation column.

FIG. 9 is a screen shot of an interface for specification of assumptions for generating a specific environment model for a distillation column. The distillation column is first identified, followed by specific assumptions being selected, such as by a user typing in a logical value, or selecting from a menu or pull down menu. For instance, some of the selections for this distillation column include presence of vapor hold up, and steady state conditions.

Figure 10:
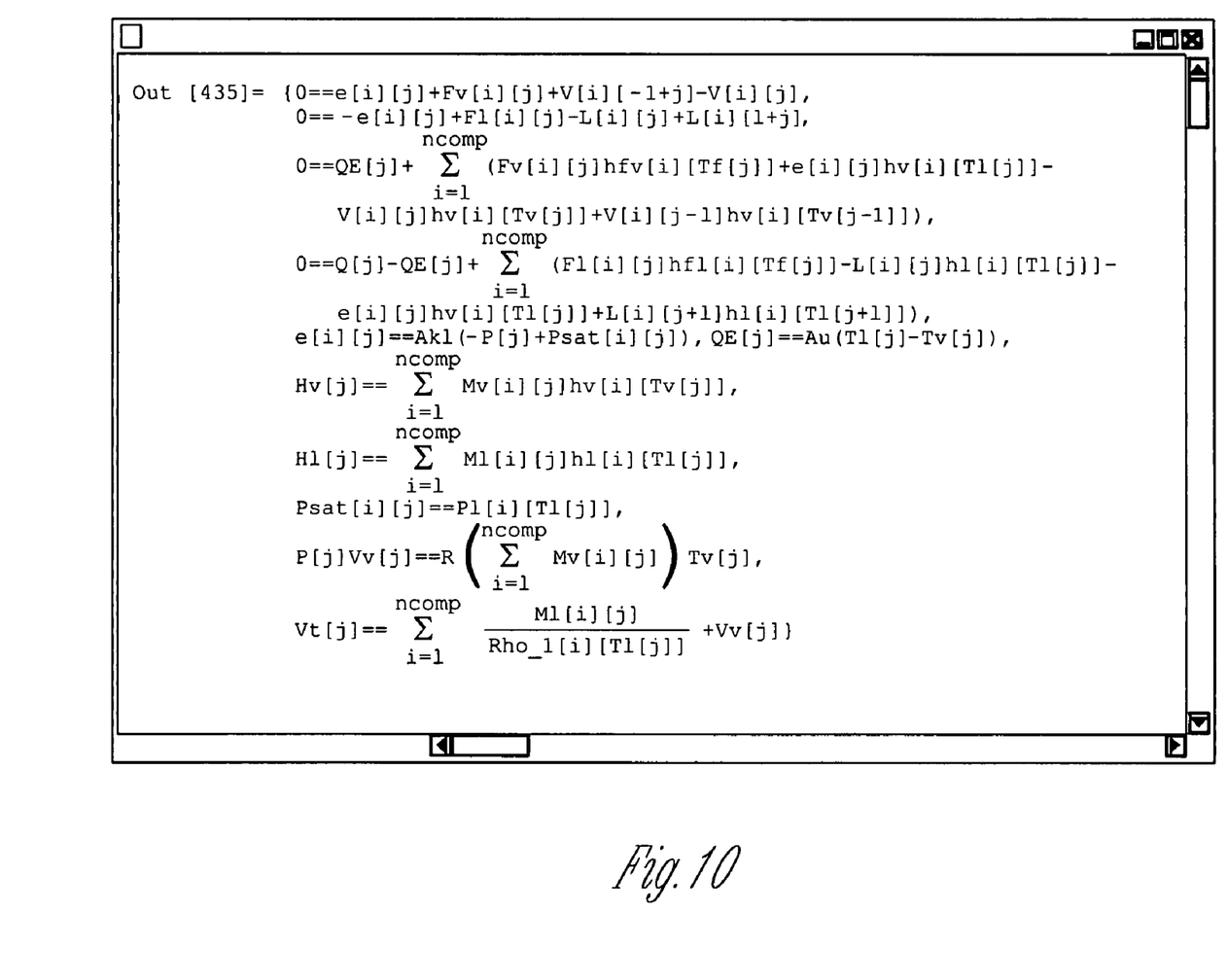
FIG. 10 is a screen shot showing the specific environment model formed based on the specification of assumptions of FIG. 9.

FIG. 10 is a screen shot showing the specific environment model formed based on the specification of assumptions of FIG. 9. The assumptions are applied to the symbolic representations of a PAM to generate an actual specific environment model. The model reflects the logical choices made in FIG. 9, and reflect at least vapor hold up and steady state conditions in the SEM that is generated.

The present invention provides significant improvements in process modeling. For example, the present invention helps integrate model development, ensure plant-model consistency, manage model uncertainty, facilitate model reuse, support the model-based needs of a variety of clients, and reduce costs of model-based applications. The present invention provides these improvements by utilizing integrated modeling and symbolic manipulation concepts embodied in proper ancestor models ("PAMs") and specific environment models ("SEMs").

What is claimed is:

1. A computer implemented method of creating process models, the method comprising:
    selecting a symbolic generic model for a component represented in a symbolic language;
    choosing assumptions about a component to be modeled; and
    applying the assumptions to the symbolic generic model to derive a component specific model reflecting the assumptions; and
    storing the component specific model on a computer-readable medium.

2. The method of claim 1 wherein the symbolic generic model comprises symbolic representations that are environment independent.

3. The method of claim 2 wherein the component specific model reflects an environment of the process to be modeled.

4. The method of claim 1 wherein the symbolic language is selected from the group consisting of Mathematica, Axiom, MAPLE and ADIFOR.

5. The method of claim 1 and further comprising maintaining a log of assumptions and applied model transformations.

6. The method of claim 1 wherein the symbolic generic model comprises a proper ancestor model.

7. The method of claim 1 wherein the component specific model comprises a specific environment model.

8. The method of claim 1 wherein multiple specific models are derived from multiple symbolic generic models corresponding to multiple components in a process or manufacturing facility.

9. The method of claim 1 wherein the symbolic generic model is a flash column.

10. The method of claim 9 wherein the symbolic generic model comprises representations of parameters selected from the group consisting of a rate of change of the mass of vapor, rate of change of a mass of liquid, energy change of a vapor, energy change of a liquid, pressure equilibrium correlation, thermal equilibrium correlation, vapor and liquid enthalpy equations, equal pressure, gas law, and volume correlation.

11. The method of claim 1 wherein the assumptions about the component to be modeled are chosen from a log of assumptions.

12. A system for creating process models, the system comprising:
    means for selecting a symbolic generic model for a component represented in a symbolic language;
    means for choosing assumptions about a component to be modeled;
    means for applying the assumptions to the symbolic generic model to derive a component specific model reflecting the assumptions; and
    means for storing the component specific model on a computer-readable medium.

13. The system of claim 12 wherein the symbolic generic model comprises symbolic representations that are environment independent.

14. The system of claim 13 wherein the component specific model reflects the environment of a process being modeled.

15. The system of claim 12 and further comprising maintaining a log of assumptions and applied model transformations.

16. The system of claim 12 wherein the symbolic generic model comprises a proper ancestor model.

17. The system of claim 12 wherein the component specific model comprises a specific environment model.

18. The system of claim 12 wherein multiple component specific models are derived from multiple symbolic generic models corresponding to multiple components in a process or manufacturing facility.

19. The system of claim 18 wherein the symbolic generic component comprises representations of parameters for a flash column selected from the group consisting of a rate of change of the mass of vapor, rate of change of a mass of liquid, energy change of a vapor, energy change of a liquid, pressure equilibrium correlation, thermal equilibrium correlation, vapor and liquid enthalpy equations, equal pressure, gas law, and volume correlation.

20. A computer readable medium having instructions for causing a computer to perform a method of creating process models, the method comprising:
    selecting a symbolic generic model for a component represented in a symbolic language;
    choosing assumptions about a component to be modeled;
    applying the assumptions to the symbolic generic model to derive a component specific model reflecting the assumptions; and
    storing the component specific model on a computer-readable medium.

21. A development environment for process modeling comprising:
    a set of generic models, each comprising a environment independent symbolic representation of a component;
    an interface that provides selectable environment specific assumptions for each component to be modeled; and
    a set of environment specific representations of the components derived from the generic models based on the assumptions.

* * * * *

UNITED STATES PATENT AND TRADEMARK OFFICE
CERTIFICATE OF CORRECTION

PATENT NO. : 7,272,544 B2
APPLICATION NO. : 10/758630
DATED : September 18, 2007
INVENTOR(S) : Vipin Gopal et al.

It is certified that error appears in the above-identified patent and that said Letters Patent is hereby corrected as shown below:

In Column 7, line 21, delete "computer-readable medium" and add --computer readable storage medium--;

In Column 7, line 27, delete "process to be modeled" and add --process being modeled--;

In Column 7, line 32, delete "assumptions and applied model transformations" and add --assumptions--;

In Column 7, line 43, delete "is a flash column" and add --represents a flash column--;

In Column 7, lines 46-51 delete "rate of change of the mass of vapor, rate of change of a mass of liquid, energy change of a vapor, energy change of a liquid, pressure equilibrium correlation, thermal equilibrium correlation, vapor and liquid enthalpy equations, equal pressure, gas law and volume correlation" and add --rate of change of a mass of a vapor, a rate of change of a mass of liquid, energy change of the vapor, energy change of the liquid, pressure equilibrium correlation, thermal equilibrium correlation, vapor and liquid enthalpy equations, gas law and volume correlation--;

In Column 8, line 9, delete "computer-readable medium" and add --computer readable storage medium--;

In Column 8, line 14, delete "the environment of a process being modeled" and add --an environment of the process being modeled--;

In Column 8, line 17, delete "assumptions and applied model transformations" and add --assumptions--;

In Column 8, lines 27-34, delete "the symbolic generic component comprises representations of parameters for a flash column selected from the group consisting of a rate of change of the mass of vapor, rate of change of a mass of liquid, energy change of a vapor, energy change of a liquid, pressure equilibrium correlation, thermal equilibrium correlation, vapor and liquid enthalpy equations, equal pressure, gas law, and volume correlation" and add --the symbolic generic model comprises representations of parameters for a flash column selected from the group consisting of a rate of change of a mass of a vapor, a rate of change of a mass liquid, energy change of the vapor, energy change of the liquid, pressure equilibrium correlation, thermal equilibrium correlation, vapor and liquid enthalpy equations, gas law, and volume correlation--;

UNITED STATES PATENT AND TRADEMARK OFFICE
CERTIFICATE OF CORRECTION

PATENT NO. : 7,272,544 B2
APPLICATION NO. : 10/758630
DATED : September 18, 2007
INVENTOR(S) : Vipin Gopal et al.

It is certified that error appears in the above-identified patent and that said Letters Patent is hereby corrected as shown below:

In Column 8, line 44, delete "computer-readable medium" and add --computer readable storage medium--;

In Column 8, line 48 delete "a environment independent" and add --an environment independent--;

In Column 8, lines 52-54 delete "representations of the components derived from the generic models based on the assumptions" and add --representations of the components forming component specific models derived from the generic models based on the assumptions; and an output interface for storing the component specific models on a computer readable storage medium--.

Signed and Sealed this

First Day of April, 2008

JON W. DUDAS
*Director of the United States Patent and Trademark Office*